US009160309B2

(12) United States Patent
Rajendran et al.

(10) Patent No.: US 9,160,309 B2
(45) Date of Patent: Oct. 13, 2015

(54) AREA EFFICIENT BASEBAND FILTER

(71) Applicant: QUALCOMM Incorporated, San Diego, CA (US)

(72) Inventors: Gireesh Rajendran, Karnataka (IN); Rakesh Kumar, Uttar Pradesh (IN); Vinod Venugopal Panikkath, San Diego, CA (US); Ayush Mittal, Karnataka (IN); Alok Joshi, Maharastra (IN)

(73) Assignee: Qualcomm Incorporated, San Diego, CA (US)

( * ) Notice: Subject to any disclaimer, the term of this patent is extended or adjusted under 35 U.S.C. 154(b) by 95 days.

(21) Appl. No.: 14/103,645

(22) Filed: Dec. 11, 2013

(65) Prior Publication Data
US 2015/0162895 A1  Jun. 11, 2015

(51) Int. Cl.
*H03B 1/04* (2006.01)
*H03H 11/12* (2006.01)
*G05F 1/445* (2006.01)
*H02M 11/00* (2006.01)
*H03H 11/04* (2006.01)

(52) U.S. Cl.
CPC ........... *H03H 11/1213* (2013.01); *G05F 1/445* (2013.01); *H02M 11/00* (2013.01); *H03H 11/045* (2013.01); *H03H 2011/0483* (2013.01)

(58) Field of Classification Search
USPC ........ 455/213, 232.1, 241.1, 250.1, 293, 339, 455/550.1; 327/551–552, 557
See application file for complete search history.

(56) References Cited

U.S. PATENT DOCUMENTS

| 5,508,570 | A | * | 4/1996 | Laber et al. ................... 327/563 |
| 5,625,317 | A | | 4/1997 | Deveirman |
| 6,144,981 | A | | 11/2000 | Kovacs et al. |
| 6,268,765 | B1 | | 7/2001 | Gopinathan et al. |
| 6,816,006 | B2 | * | 11/2004 | Ravatin et al. ................ 327/553 |
| 7,051,063 | B2 | | 5/2006 | Kaczynski et al. |
| 7,075,364 | B2 | * | 7/2006 | Gudem et al. ................ 327/552 |
| 7,425,863 | B2 | * | 9/2008 | Gatta et al. ................... 327/558 |
| 7,450,649 | B2 | | 11/2008 | Gregorius et al. |
| 7,764,124 | B2 | | 7/2010 | Aram |
| 7,952,408 | B2 | | 5/2011 | Eisenstadt et al. |
| 8,731,505 | B2 | * | 5/2014 | Leme et al. ................... 455/314 |
| 2010/0117724 | A1 | | 5/2010 | Ishiguro |
| 2012/0071111 | A1 | | 3/2012 | Oliaei et al. |

OTHER PUBLICATIONS

Kitsunezuka, Masaki et al., "A Widely-Tunable, Reconfigurable CMOS Analog Baseband IC for Software-Defined Radio," IEEE Journal of Solid-State Circuits, IEEE Service Center, Piscataway, NJ, USA, vol. 44, No. 9, Sep. 2009, pp. 2496-2502, XP011275835, ISSN: 0018-9200.
International Search Report and Written Opinion—PCT/US2014/067875—ISA/EPO—Feb. 18, 2015, 16 pages.

* cited by examiner

*Primary Examiner* — An Luu
(74) *Attorney, Agent, or Firm* — Toler Law Group, PC

(57) ABSTRACT

An area efficient baseband filter is disclosed. In an exemplary embodiment, an apparatus includes a current to voltage (I-V) filter configured to receive an input current signal at an input port and generate a filtered output voltage signal at an output port based on a feedback transconductance. The input current signal comprises an input DC current in addition to a signal current. The apparatus also includes a feedback circuit connected between the output port and the input port, the feedback circuit having at least one transistor configured to couple the input DC current to a signal ground and to provide the feedback transconductance for the I-V filter.

16 Claims, 3 Drawing Sheets

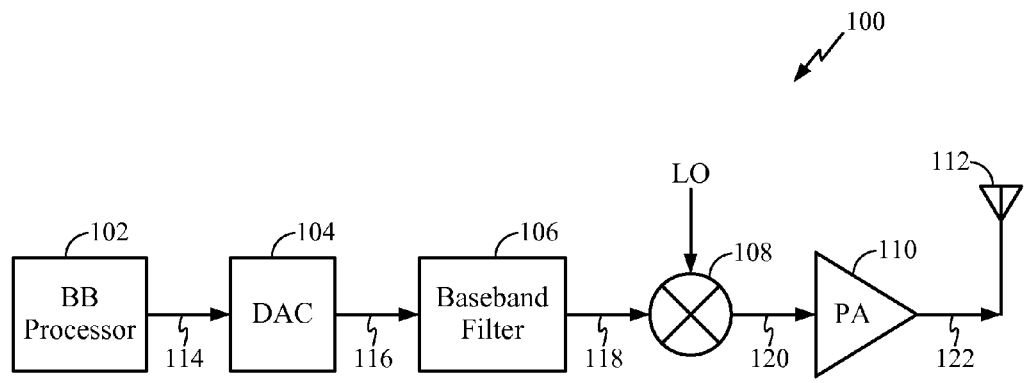
FIG. 1
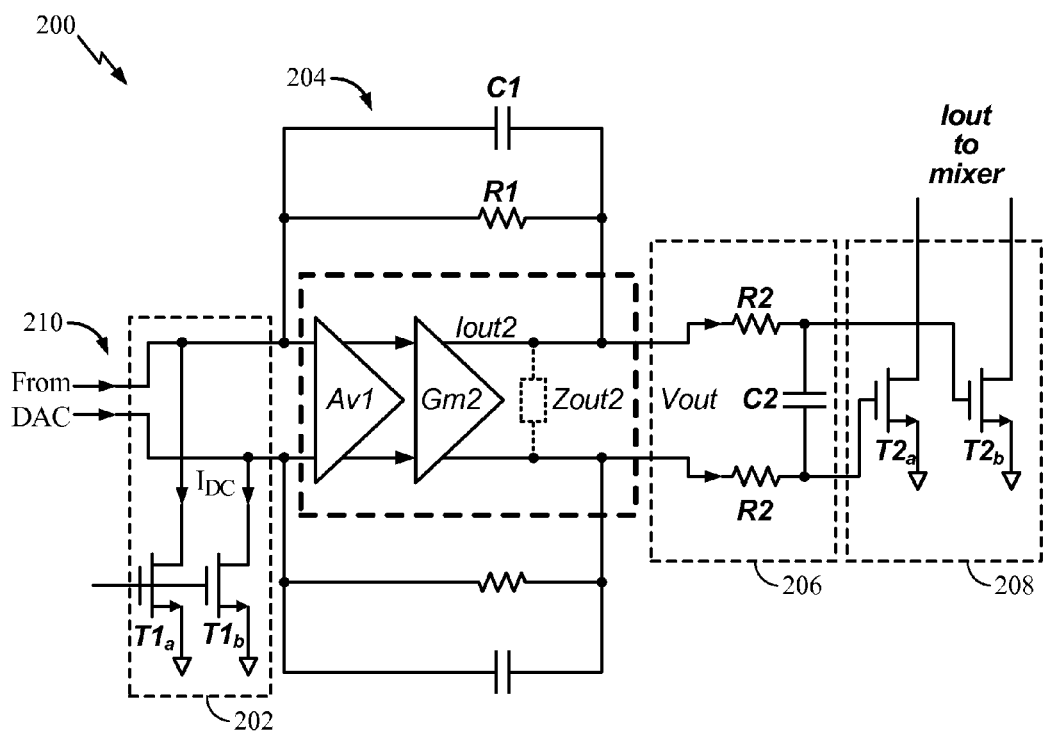
**FIG. 2 –
Prior Art**

AREA EFFICIENT BASEBAND FILTER

BACKGROUND

1. Field

The present application relates generally to the operation and design of analog front ends, and more particularly, to the operation and design of area efficient baseband filters.

2. Background

Wireless devices are becoming increasing more complicated and now routinely provide multi-mode and multi-band operation. As a result, efficient utilization of circuit area has become a primary concern. A typical transmitter front end includes a digital-to-analog converter (DAC) to convert digital data to baseband analog signals. Signal conditioning, such as baseband filtering, is used to prepare the baseband analog signals for input to an up-converting mixer. It is desirable to have the signal conditioning utilize as little circuit area as possible while still allowing the transmitter front end to achieve a desired level of signal to noise (SNR) performance.

A typical baseband filter may include an amplifier, a transconductor, and a variety of passive components in a feedback configuration that are used to set the filter response. For example, the filter response may be determined from a product of the resistors and capacitors used in the feedback configuration. Typically, a majority of the circuit area is occupied by the passive elements and the amplifier area, and therefore the circuit area is determined by the number and types of components needed to achieve a desired SNR.

Therefore, it would be desirable to have an improved baseband filter that provides a desired level of noise performance while utilizing less circuit area than conventional baseband filters.

BRIEF DESCRIPTION OF THE DRAWINGS

The foregoing aspects described herein will become more readily apparent by reference to the following description when taken in conjunction with the accompanying drawings wherein:

FIG. 1 shows an exemplary embodiment of a front end comprising a novel baseband filter for use in a wireless device;

FIG. 2 shows a diagram of a conventional baseband filter;

DETAILED DESCRIPTION

Figure 3:
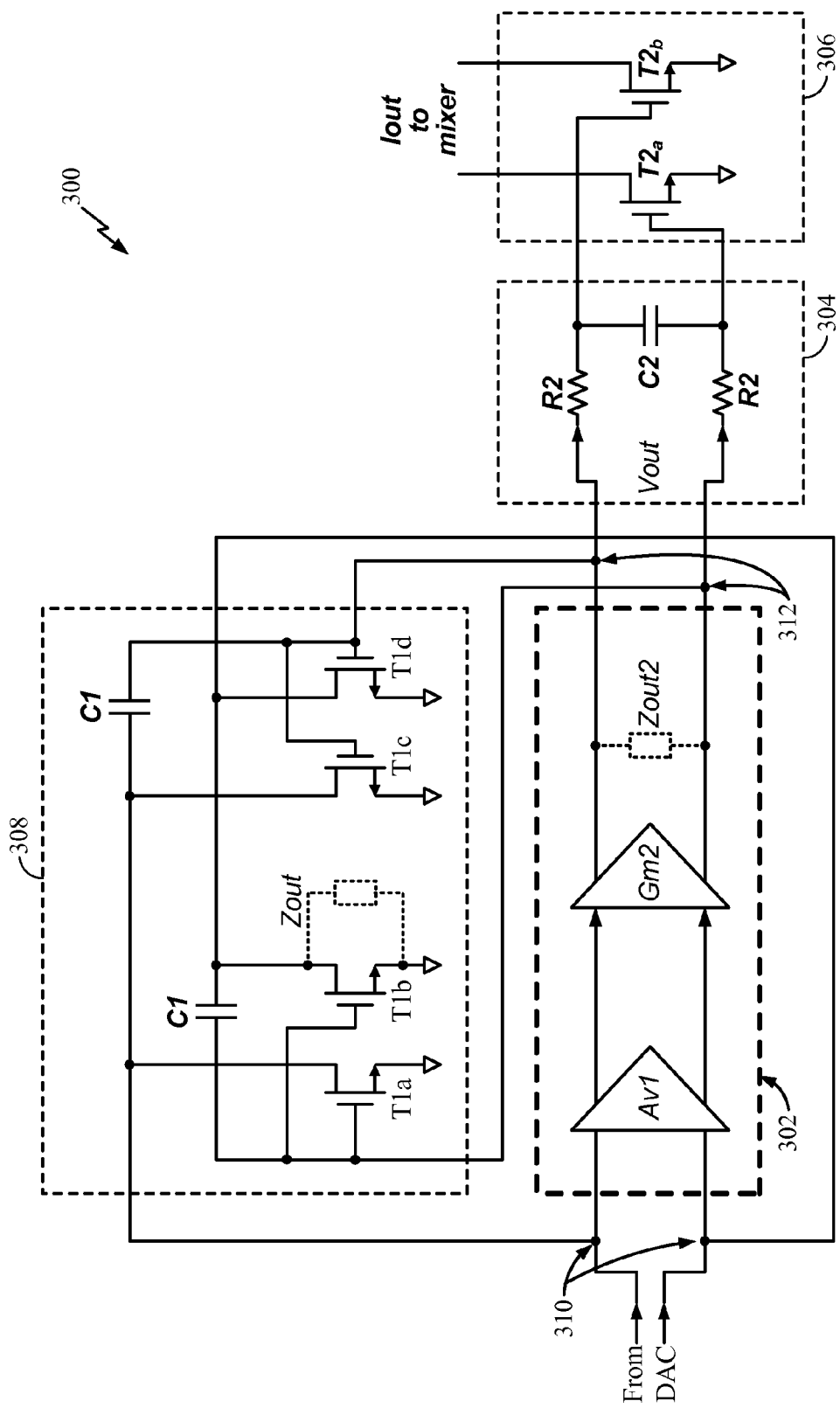
FIG. 3 shows an exemplary embodiment of a baseband filter configured for improved linearity and reduced circuit area.

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

FIG. 1 shows an exemplary embodiment of a front end 100 comprising a novel baseband filter 106 for use in a wireless device. The front end 100 comprises a baseband (BB) processor 102, a digital-to-analog converter (DAC) 104, the novel baseband filter 106, a mixer (or up-converter) 108, a power amplifier (PA) 110, and an antenna 112.

During operation, the BB processor 102 outputs digital signals 114 for transmission. The digital signals 114 are input to the DAC 104 and converted to an analog baseband signal 116. The analog baseband signal 116 is input to the novel baseband filter 106 to generate a filtered baseband signal 118 that is input to the mixer 108. The mixer 108 operates to up-covert the filtered baseband signal 118 to a radio frequency (RF) signal 120 based on a local oscillator (LO) signal. The RF signal 120 is input to the PA 110 to generate an amplified RF signal 122 that is transmitted by the antenna 112.

In various exemplary embodiments, the novel baseband filter 106 is configured to provide better linearity and require less circuit area then conventional baseband filters, thereby allowing the front end 100 to achieve the same or better noise performance as conventional circuits while utilizing less circuit area. A more detailed description of various exemplary embodiments of the novel baseband filter 106 is provided below.

FIG. 2 shows a diagram of a conventional baseband filter 200. The baseband filter 200 comprises a current sink circuit 202, a current-to-voltage (I-V) filter 204, a secondary filter 206 and a transconductor 208.

During operation, the current sink circuit 202 receives analog baseband current signals 210 that include a DC current component ($I_{DC}$). For example, the current signals 210 are received from a DAC, such as the DAC 104 shown in FIG. 1. The current sink circuit 202 comprises transistors (T1a) and (T1a) that operate to sink the DC current ($I_{DC}$) to signal ground and to set the operating point of the I-V filter 204.

The (I-V) filter 204 is configured to filter input analog current signals and convert these signals to a voltage that is input to the secondary filter 206. The I-V filter 204 comprises two stages (Av1 and Gm2) and utilizes resistor R1 and capacitor C1 in a feedback configuration to filter the input current signals and generate a filtered output voltage signal (Vout). The impedance Zout2 is inherent to the device that forms gm2. The output voltage signal (Vout) is filtered by the secondary filter 206 and the filtered output is input to transistors (T2a) and (T2b) of the transconductor 208. The outputs (Iout) of the transconductor 208 are current signal that are input to an up-converting mixer.

The conventional baseband filter 200 has limitations with regards to linearity and noise performance given the amount of circuit area that is utilized. For example, the linearity of the filter 200 is limited by the I-V curve of transconductor T2. With regards to noise performance, the noise budget includes noise associated with the transistor "T1", the amplifier (Av1, gm2), and the filter resistors (R1, R2). The noise from "T1", (which is a transistor that is not used for any signal shaping function) reduces the noise level that can be budgeted to the amplifier & filter resistors. The reduced noise allowance for the amplifier and filter resistors increases the circuit area needed for the amplifier and filter resistor components to meet the total noise specification. Accordingly, it would be desirable to have an improved baseband filter that provides better linearity and utilizes less circuit area to provide the same or better noise performance than the conventional baseband filter 200.

FIG. 3 shows a detailed exemplary embodiment of a baseband filter 300 configured for improved linearity and reduced circuit area. For example, the baseband filter 300 is suitable for use as the baseband filter 106 shown in FIG. 1, and is configured to provide better linearity and circuit area efficiency over the conventional baseband filter 200 shown in FIG. 2. The baseband filter 300 comprises an I-V filter that includes amplifier 302 and feedback circuit 308. The baseband filter 300 also includes a secondary filter 304 and a transconductor 306.

It should be noted that the baseband filter 300 does not include the DC current sink circuit (i.e., circuit 202 shown in FIG. 2) at the input to the amplifier 302 as in the conventional baseband filter 200. The elimination of the DC current sink circuit 202 operates to save circuit area making the filter 300 more area efficient. Thus, analog current signals from the DAC that include the DC current ($I_{DC}$) are received at the input terminals 310. The amplifier 302 comprises two stages, namely; Av1 and Gm2. The output voltage generated at the output terminals 312 from the Gm2 stage is input to the secondary filter 304.

The amplifier 302 configuration and the feedback circuit 308 that is connected from output terminals 312 to the input terminals 310 through transistors T1a-T1d will ensure that the voltage generated at the output terminals 312 is sufficient to make the current flowing through transistors T1a-T1d highly linear. Any non linear (voltage input to output current) conversion property of transistors T1a-T1d will get suppressed by the total gain of the configuration, (i.e., Av1*Gm2*Zout2). By using transistors T2a and T2b that have similar (voltage input to current output) behavior as T1a-T1d, a highly linear output current (Iout) can be obtained from the transistors T2a and T2b. The transconductance of transistors T1a-T1b can be analyzed as the final feedback resistor of a simple integrator structure as shown in FIG. 3 or that of any generic filter structure with at least one feedback resistor from final output to input.

The feedback circuit 308 comprising transistors T1(a-d) is configured to perform two functions. First, the transistors T1(a-d) are configured to utilize the DC input current to bias the Gm2 stage to provide (1/R) that is used to realize a filter pole (i.e., to provide a feedback transconductance that determines a transfer function of the I-V filter). The transistors T1(a-d) are also used as a DC current sink to remove the DC current from the input currents received from the DAC at nodes 310. Thus, the transistors T1a-T1d perform two functions, namely; for realizing the "R" needed for the integrator/filter and for biasing the DAC. As a result, at least one noise source included in the conventional baseband filter 200 is eliminated from the novel baseband filter 300, namely; the DC current sink circuit 202.

The transistors T1(a-d) are used as one of the R's needed for filtering (R1=1/gm of T2). The differential transconductance (Gm) is kept the same as 1/R1 and this can be made different from the common mode transconductance of "T1" by the structure shown in FIG. 2. Furthermore, the combination of (R2*C2) and ((1/Gm)*C1) can be used to realize the filter response of the baseband filter 300.

In various exemplary embodiments, a novel filter 300 is disclosed that can be utilized in the baseband architecture of a transmitter to improve linearity and reduce the total area by reducing the number of noise elements. The embodiments increase the R value and reduce the C value to obtain a given filter response while maintaining similar in-band noise. Furthermore, the various exemplary embodiments improve mixer input current linearity by utilizing one of the main noise elements as both a feedback element and a replica bias element.

Figure 4:
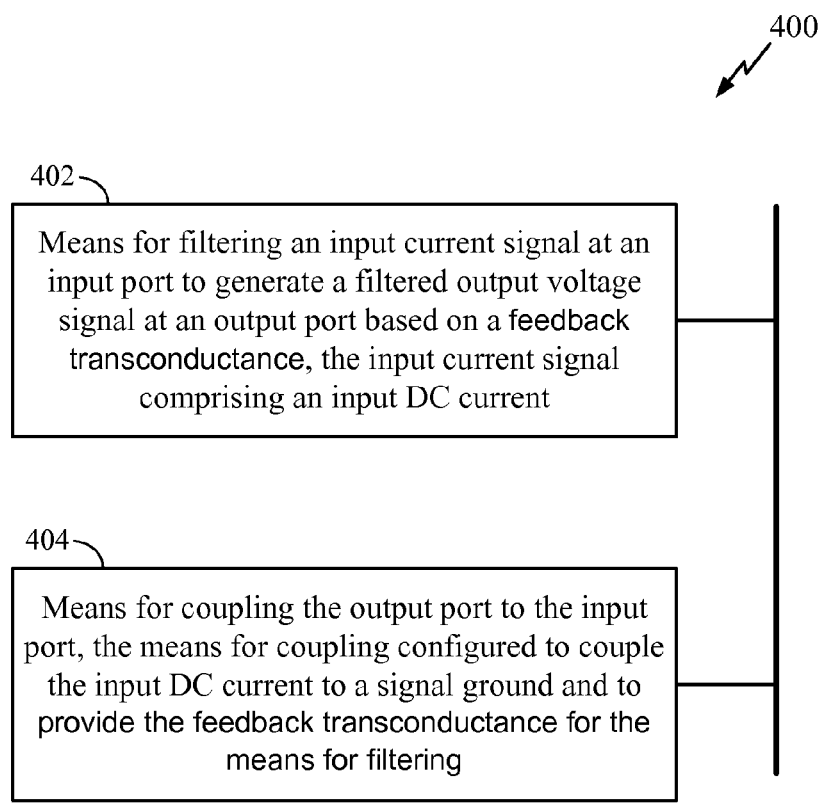
FIG. 4 shows an exemplary embodiment of a baseband filter apparatus configured for improved linearity and reduced circuit area.

FIG. 4 shows an exemplary embodiment of a baseband filter apparatus 400 configured for improved linearity and reduced circuit area. For example, the apparatus 400 is suitable for use as the baseband filter 106 shown in FIG. 1 or the baseband filter 300 shown in FIG. 3. In an aspect, the apparatus 400 is implemented by one or more modules configured to provide the functions as described herein. For example, in an aspect, each module comprises hardware and/or hardware executing software.

The apparatus 400 comprises a first module comprising means (402) for filtering an input current signal at an input port to generate a filtered output voltage signal at an output port based on a feedback transconductance, the input current signal comprising an input DC current, which in an aspect comprises the amplifier 302.

The apparatus 400 comprises a second module comprising means (404) for coupling the output port to the input port, the means for coupling configured to couple the input DC current to a signal ground and to provide the feedback transconductance for the means for filtering, which in an aspect comprises the feedback circuit 308.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistor types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
  a current to voltage (I-V) filter configured to receive an input current signal at an input port and to generate a filtered output voltage signal at an output port based on a feedback transconductance, the input current signal comprising an input DC current; and
  a feedback circuit connected between the output port and the input port, the feedback circuit having at least one transistor configured to couple the input DC current to a signal ground and to provide the feedback transconductance for the I-V filter.

2. The apparatus of claim 1, further comprising a secondary filter configured to receive the filtered output voltage signal and generate a corresponding filtered voltage signal.

3. The apparatus of claim 2, further comprising a transconductor configured to receive the filtered voltage signal and generate a corresponding current that is input to an upconverter.

4. The apparatus of claim 1, the I-V filter comprising a multistage filter that has at least one feedback element from the output port to the input port.

5. The apparatus of claim 4, the multistage filter comprising a gain stage and a transconductance stage.

6. The apparatus of claim 1, the feedback circuit comprising first and second transistors having drain terminals connected to a first input terminal of the input port, source terminals connected to a ground signal, and first and second gate terminals connected to first and second output terminals of the output port, respectively.

7. The apparatus of claim 6, the feedback circuit comprising third and fourth transistors having drain terminals connected to a second input terminal of the input port, source terminals connected to the ground signal, and first and second gate terminals connected to the first and second output terminals of the output port, respectively.

8. The apparatus of claim 7, the feedback circuit comprising a first capacitor connected between the first input terminal of the input port and the first output terminal of the output port, and a second capacitor connected between the second input terminal of the input port and the second output terminal of the output port.

9. An apparatus comprising:
  means for filtering an input current signal at an input port to generate a filtered output voltage signal at an output port based on a feedback transconductance, the input current signal comprising an input DC current; and
  means for coupling the output port to the input port, the means for coupling configured to couple the input DC current to a signal ground and to provide the feedback transconductance for the means for filtering.

10. The apparatus of claim 9, further comprising a second means for filtering configured receive the output voltage signal and generate a corresponding filtered voltage signal.

11. The apparatus of claim 10, further comprising means for receiving the filtered voltage signal and generating a corresponding current that is input to an upconverter.

12. The apparatus of claim 9, the means for filtering comprising a multistage filter that has at least one feedback element from the output port to the input port.

13. The apparatus of claim 12, the multistage filter comprising a gain stage and a transconductance stage.

14. The apparatus of claim 9, the means for coupling comprising first and second transistors having drain terminals connected to a first input terminal of the input port, source terminals connected to a ground signal, and first and second gate terminals connected to first and second output terminals of the output port, respectively.

15. The apparatus of claim 14, the means for coupling comprising third and fourth transistors having drain terminals connected to a second input terminal of the input port, source terminals connected to the ground signal, and first and second gate terminals connected to the first and second output terminals of the output port, respectively.

16. The apparatus of claim 15, the means for coupling comprising a first capacitor connected between the first input terminal of the input port and the first output terminal of the output port, and a second capacitor connected between the second input terminal of the input port and the second output terminal of the output port.

* * * * *